United States Patent [19]

Duhl et al.

[11] Patent Number: 4,597,809
[45] Date of Patent: Jul. 1, 1986

[54] HIGH STRENGTH HOT CORROSION RESISTANT SINGLE CRYSTALS CONTAINING TANTALUM CARBIDE

[75] Inventors: David N. Duhl, Newington; Otis Y. Chen, Manchester, both of Conn.

[73] Assignee: United Technologies Corporation, Hartford, Conn.

[21] Appl. No.: 578,903

[22] Filed: Feb. 10, 1984

[51] Int. Cl.⁴ ............................................. C22C 19/05
[52] U.S. Cl. .................................. 148/404; 148/410; 148/428
[58] Field of Search ..................... 148/404, 410, 428; 420/448

[56] References Cited

U.S. PATENT DOCUMENTS 3,799,769  3/1974  Tarshis et al. ..................... 420/448

*Primary Examiner*—R. Dean
*Attorney, Agent, or Firm*—Charles E. Sohl

[57] ABSTRACT

Corrosion resistant, high strength, superalloy single crystal articles are described. Starting with a nominal composition of 11.75% Cr, 9% Co, 1.75% Mo, 4.5% W, 2.5% Ta, 2.5% Al, 4% Ti, balance essentially nickel, intentional additions are made of carbon and extra tantalum. From 0.05–0.15% carbon is added along with sufficient tantalum to combine with the carbon to form tantalum carbon. The resultant articles have substantially improved hot corrosion resistance and creep properties.

4 Claims, 2 Drawing Figures

100 X

100 X

HIGH STRENGTH HOT CORROSION RESISTANT SINGLE CRYSTALS CONTAINING TANTALUM CARBIDE

The Government has rights in this invention pursuant to Contract N00024-78-C-5346 awarded by the Department of the Navy.

TECHNICAL FIELD

This invention relates to the field of nickel base superalloy articles which have good mechanical properties at elevated temperatures and are resistant to hot corrosion.

BACKGROUND ART

The increasing demands for efficiency in gas turbine engines have resulted in a demand for materials capable of withstanding more severe operating conditions. In particular, increased strength is required for certain applications along with the resistance to hot corrosion.

U.S. Pat. No. 3,494,709 describes the fabrication of gas turbine components in single crystal form for improved performance. U.S. Pat. No. 3,567,526 describes how certain mechanical properties can be improved by the essential elimination of carbon from single crystal superalloy articles U.S. Pat. No. 4,116,723 describes a heat treatment applicable to single crystal superalloy articles for enhancing their properties. U.S. Pat. No. 3,619,182 describes a moderate strength superalloy, commercially known as In 792, having superior corrosion reistance. Copending application U.S. Ser. No. 336,002 filed on Dec. 30, 1981 discloses surprising and unexpected mechanical property improvements resulting from the fabrication of carbon free IN 792 type composition in single crystal form. The contents of U.S. Pat. No. 3,619,182 and copending commonly owned U.S. application Ser. No. 336,002 are incorporated herein by reference.

The present invention arose from an investigation of the effects of the minor elements carbon, boron, zirconium and hafnium on the properties of certain commercial alloys in single crystal form (the major function of these minor elements appears to involve grain boundary strengthening). As described in copending application U.S. Ser. No. 336,002, it had previously been determined that fabrication of an alloy known as IN 792 (described in U.S. Pat. No. 3,619,182) in single crystal (but without grain boundary strengtheners) form provided substantial and unexpected benefits in mechanical properties. The single crystal IN 792 articles evaluated had no intentional additions of carbon, boron, zirconium or hafnium. In the course of the investigation of the effects of the minor elements on IN 792, it was observed that adding small amounts of carbon, i.e. 0.10 wt. % to IN 792 single crystals substantially improved the hot corrosion resistance but at the same time substantially reduced the mechanical properties of the material. The improvement of the hot corrosion resistance was completely unexpected and is not understood. As a further step in the investigation, additions of tantalum were made to the basic IN 792 composition in coordination with the added carbon and it was found that when the added tantalum and carbon contents were balanced (to tie up the carbon as tantalum carbide) a good combination of improved mechanical properties and improved corrosion resistance resulted.

Unless otherwise indicated, all percent figures in this application are weight percent values.

DISCLOSURE OF INVENTION

Alloys having the composition of 9.5–14% chromium, 7–11% cobalt, 1–2.5% molybdenum, 3–6% tungsten, 1–4% tantalum, 3–4% aluminum, 3–5% titanium, 6.5–8% (aluminum+titanium), balance essentially nickel are provided with improved mechanical properties and improved corrosion resistance in single crystal form by the addition of about 0.05–0.15% carbon in combination with an extra amount of tantalum equal to from about 7 to about 17 times the carbon content. The combination of the tantalum and the carbon provide a visible precipitate of a phase based on tantalum carbide present in a volume fraction of from about 0.4% to about 1.5%. Addition of coordinated amounts of tantalum and carbon can improve the 1% creep life by 2.6–3.1X (i.e. at least 2X) while increasing the hot corrosion resistance by 2.4X (i.e. at least 2X) when compared with IN 792 material in single crystal form without additions of carbon or extra tantalum.

The invention composition will be cast in single crystal form according to the teachings of various prior art patents including U.S. Pat. Nos. 3,700,023, 3,763,926 and 4,190,094 which are incorporated herein by reference. Typically the casting orientation will have the <100> axis parallel to the principal stress axis of the component. The present composition after being cast in single crystal form will also undoubtedly be heat treated in order to improve the mechanical properties of the alloy by controlling the gamma prime particle size in accordance with the teachings of U.S. Pat. No. 4,116,723 which is incorporated herein by reference.

Other features and advantages will be apparent from the specification and claims which illustrate an embodiment of the invention.

BEST MODE FOR CARRYING OUT THE INVENTION

Figure 1:
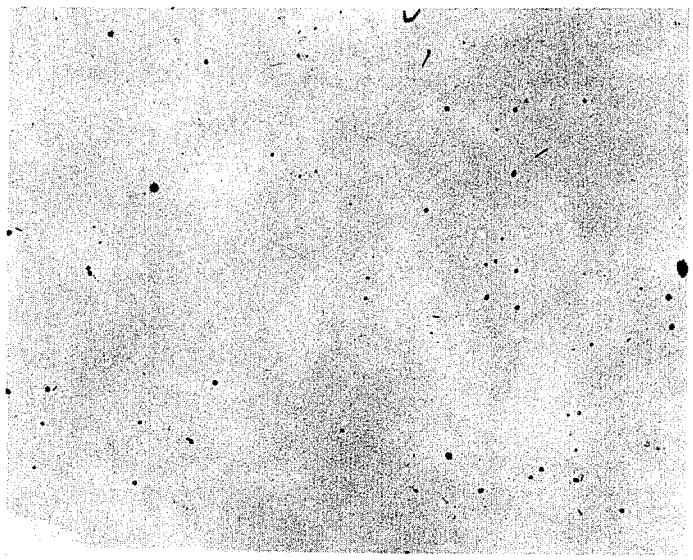
FIG. 1 is a photomicrograph of single crystal carbon free IN 792 material.

The present invention comprises adding carbon and extra tantalum in coordinated amounts to a commercial alloy known as IN 792 (which is otherwise free from grain boundary strengthening elements) and fabricating this modified composition into single crystal form (from 0.05–0.15% C along with extra tantalum to combine with the carbon to form TaC are employed). The base composition for alloy IN 792 is described in U.S. Pat. No. 3,619,182. This composition given in the patent is modified only to the extent of eliminating the minor elements which would not normally be added to single crystal articles (see U.S. Pat. Nos. 4,116,723 and 3,567,526). The resultant composition is 9.5–14% chromium, 7–11% cobalt, 1–2.5% molybdenum, 3–6% tungsten, 1–4% tantalum, 3–4% aluminum, 3–5% titanium, with the sum of aluminum and titanium being from about 6.5 to about 8%, up to 1% columbium, balance essentially nickel. To this composition is added from about 0.05 to about 0.15% carbon and preferably from about 0.07 to about 0.12% carbon. An addition of tantalum, coordinated with the carbon addition, must also be made. The amount of tantalum which will balance the amount of carbon added, producing tantalum carbide, is an amount of tantalum equal to about 15 times the weight percent carbon added. The range of the tantalum to carbon ratio, however, is broader than this being from about 7 to about 17 times the carbon content and preferably from about 12 to about 16 times the carbon content. The resultant structure can be described as a matrix whose composition is that set out for IN 792 in U.S. Pat. No. 3,619,182 (but without C, B, Zr or Hf) which contains about 0.4 to 1.5 vol. % of TaC type particles. These particles are randomly oriented despite the directionally solidified structure.

The benefits obtainable through the present modification of the IN 792 alloy are set out in the Tables. The data in the Tables were based on measurements made on conventionally cast commercially available IN 792, single crystal IN 792 free from additions of carbon (as set out in pending application U.S. Ser. No. 336,002), single crystal articles of alloy IN 792 containing about 0.1% carbon, and the article of the invention, a single crystal based on alloy IN 792 but containing 0.07% carbon in combination with a nominal 4.05% tantalum addition and an extra amount of tantalum equal to about 1.05% tantalum to balance out the carbon addition. The composition of the tested invention material was 11.8% Cr, 4.0% W, 5.1% Ta, 3.7% Al, 4.2% Ti, 9.0% Co, 1.96% Mo, 0.07% C, balance Ni. This material was cast in single crystal form, solution treated at 2275° F. for 4 hrs. and aged at 2050° F. for 4 hrs. All other materials were given similar heat treatments except that the conventional IN 792 could not be solution treated without undergoing incipient melting. Table I shows the time to produce 1% creep in a specimen tested at 1600° F. with an applied stress of 55 ksi and at 1800° F. with an applied stress of 25 ksi. Similar data are also provided for rupture life and data are presented for hot corrosion resistance at 1650° F. Corrosion testing was performed at 1650° F. in a corrosion gaseous environment produced by combustion of Jet A fuel (30:1 air fuel ratio) with addition of 20 ppm of ASTM sea salt and sufficient sulfur dioxide to produce a sulfur content equivalent to a 1.3% S content in the fuel. The numbers presented are the hours of exposure required to produce 1 mil of corrosive attack.

With reference to the mechanical properties it can be seen that the change in properties resulting from a change in the casting technique, going from conventional polycrystalline castings to single crystal castings is substantial, on the order of 6–16X. It can also be seen that the corrosion behavior is reduced by the change in casting technique. In going from single crystal IN 792 to single crystal IN 792 plus carbon, it can be seen that the corrosion behavior is substantially increased but that the mechanical properties drop significantly so that the mechanical properties of the carbon modified single crystal IN 792 are on the same order of magnitude as those of the conventionally cast IN 792.

TABLE I

|  | Time to 1% Creep, Hrs. | | Rupture Life, Hrs. | | Hot Corrosion Hrs/Mil at |
|---|---|---|---|---|---|
|  | 1600° F./55 KSI | 1800° F./25 KSI | 1600° F./55 KSI | 1800° F./25 KSI | 1650° F. |
| A. CC IN792 (carbon containing) | 9 | 13 | 28 | 36 | 19 |
| B. SC IN792 (No C) | 60 | 78 | 460 | 365 | 7 |
| C. SC IN792 + C | 14 | 32 | 155 | 200 | 18 |
| D. SC IN792 + Ta + C | 154 | 244 | 692 | 827 | 16 |

A review of the microstructure of the carbon modified IN 792 single crystal material showed that the carbon was present in the solidified structure in the form of randomly oriented tantalum carbides. Other alloying elements may partition to the TaC phase in small amounts. Since tantalum is known to be a solid solution strengthening element, it was hypothesized that the formation of the tantalum carbide was reducing the effectiveness of tantalum as a strengthening agent. To test this hypothesis extra tantalum was added so that the tantalum content in solid solution was restored to the level which would be observed in conventional IN 792 material. The result is shown in the Table and it can be seen that this addition of tantalum to balance out the carbon substantially increases the mechanical properties without dropping the corrosion behavior to the level observed in nonmodified IN 792 material. There is a decrease in the corrosion resistance but the corrosion behavior of the modified invention material is still comparable to that of the conventional IN 792 material.

TABLE II

|  | Relative 1% Creep Life | | Relative Rupture Life | | Relative 1650° F. Hot Corrosion |
|---|---|---|---|---|---|
|  | 1600° F./55 KSI | 1800° F./25 KSI | 1600° F./55 KSI | 1800° F./25 KSI |  |
| A. SC IN792[1] / CC IN792[2] | 6.7 | 6 | 16.4 | 10.1 | .4 |
| B. SC IN792 + C[2] / CC IN792[2] | 1.6 | 2.5 | 5.5 | 5.6 | 1 |
| C. SC IN792 + C[2] / SC IN792[1] | .2 | .4 | .3 | .6 | 2.6 |
| D. SC IN792 + TaC[3] / CC IN792[2] | 17.1 | 18.8 | 24.7 | 22.9 | .8 |
| E. SC IN792 + TaC[3] / SC IN792 +[2] | 11 | 7.6 | 4.5 | 4.1 | .9 |
| F. SC IN792 + TaC[3] | 2.6 | 3.1 | 1.5 | 2.3 | 2.3 |

TABLE II-continued

| | Relative 1% Creep Life | | Relative Rupture Life | | Relative 1650° F. Hot Corrosion |
|---|---|---|---|---|---|
| | 1600° F./55 KSI | 1800° F./25 KSI | 1600° F./55 KSI | 1800° F./25 KSI | |
| SC IN792[1] | | | | | |

[1]Carbon free (USSN 336,002)
[2]Carbon containing
[3]Contains carbon and extra tantalum (invention)
SC = single crystal
CC = Conventional casting The data presented in Table I also forms the basis for Table II. Table II contains ratios based on the data of Table I permitting the ready comparison of the different material conditions and compositions of Table I. Row A shows the ratios of the properties between single crystal IN 792 (carbon free) and conventionally cast IN 792 (carbon containing). Row A illustrates that the invention claimed in pending application U.S. Ser No. 336,002 (i.e. the production of IN 792 single crystals without carbon, boron, zirconium or hafnium) provides significant benefits in mechanical properties while reducing the hot corrosion performance. Row B shows the property ratios between single crystal IN 792 (containing carbon but without extra tantalum) and conventionally cast IN 792 (containing carbon). These ratios show that carbon containing single crystal IN 792 has equivalent hot corrosion resistance to conventionally cast IN 792 and the mechanical properties of the carbon modified single crystal material are improved relative to conventionally cast material. This point is further illustrated in Row C which shows the property ratios between single crystal IN 792 (with carbon but without extra tantalum) and single crystal IN 792 (carbon free). It can be seen that adding carbon (alone) to single crystal IN 792 reduces the mechanical properties significantly although the corrosion resistance of the modified material is significantly increased. Row D illustrates the relationship between the present invention material (single crystal IN 792+Ta+C) and conventionally cast IN 792 (with carbon) and it is apparent that the combination of single crystal casting and coordinated additions of carbon and tantalum produce substantial improvements in mechanical properties measured relative to conventional material. The mechanical properties increase by factors ranging from 17.1X to 24.7X while the corrosion resistance is essentially equivalent. Row E shows the ratios between single crystal IN 792 material (containing both tantalum and carbon) according to the invention and single crystal IN 792 material (containing carbon only). It can be seen that the effect of adding the coordinated amount of tantalum required by the invention is to improve the mechanical properties significantly, by factors ranging from 4.1X to 11X slightly reducing the corrosion resistance. The final row, Row F, illustrates the ratio between the invention material, single crystal IN 792 (containing both tantalum and carbon) and single crystal IN 792, containing no intentional carbon, the subject material of U.S. Ser. No. 336,002. The ratios in Row F show that additions of coordinated amounts of carbon and tantalum increase the 1% creep life by an average of 2.85X (i.e. by at least 2X) as well as increase the corrosion properties by a factor of 2.4X (i.e. by at least 2X). The beneficial results obtained from the present invention and illustrated in Table II are not predictable from anything known in the art and the resultant alloy has a combination of properties which is highly useful.

Figure 2:
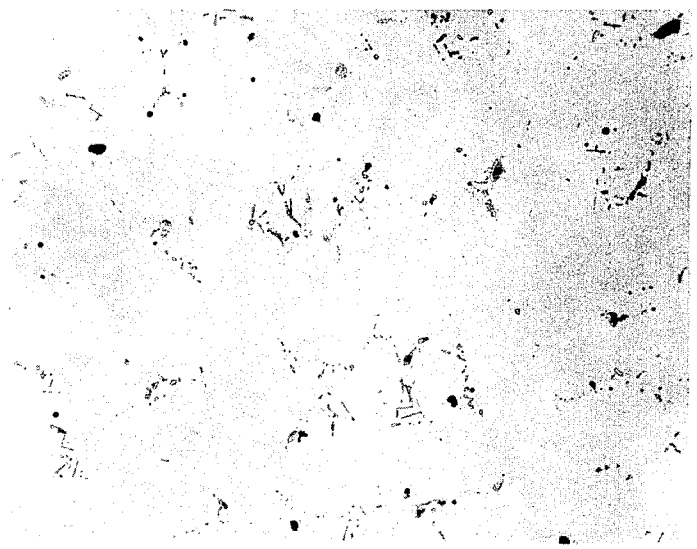
FIG. 2 is a photomicrograph of single crystal IN 792 material containing carbon and extra tantalum.

FIGS. 1 and 2 are photomicrographs of IN 792 material with and without the invention modifications. The circular dark features in both photomicrographs are porosity resulting from nonideal laboratory pressing.

FIG. 1 shows the microstructure of carbon free IN 792 single crystal material. No perceptible quantities of the tantalum carbide phase are visible. FIG. 2 shows the microstructure of single crystal IN 792 material modified according to the present invention, material that contains approximately 0.07% carbon in combination with about 1.05% extra tantalum. The combination of carbon and tantalum provides approximately 0.5 vol. % of the tantalum carbide phase which can be readily seen.

It should be understood that the invention is not limited to the particular embodiments shown and described herein, but that various changes and modifications may be made without departing from the spirit and scope of this novel concept as defined by the following claims.

We claim:

1. A high strength corrosion resistant nickel base single crystal superalloy article which comprises: a matrix consisting essentially of 9.5-14% chromium
7-11% cobalt
1-2.5% molybdenum
3-6% tungsten
1-4% tantalum
3-4% aluminum
3-5% Titanium
6.5-8% aluminum+titanium
0-1% columbium
balance essentially nickel said matrix containing from about 0.4 to 1.5 volume % of a phase based on tantalum carbide, said article having at least twice the hot corrosion resistance (measured at 1650° F.) and at least twice the 1% creep life (measured 1600° F./55 ksi) when compared with a similar article having the same matrix but without intentional tantalum carbide contents.

2. In the method of fabricating high strength hot corrosion articles from material whose consisting essentially of 9.5-14% chromium
7-11% cobalt
1-2.5% molybdenum
3-6% tungsten
1-4% tantalum
3-4% aluminum
3-5% titanium
6.5-8% aluminum+titanium
0-1% columbium balance essentially nickel by casting said material in a single crystal form, the improvement which comprises: adding from about 0.05 to about 0.15% carbon along with extra tantalum in an amount from 1 to 17 times the carbon addition to the material, whereby the strength and hot corrosion resistance of the resultant article will be substantially improved.

3. A method as in claim 2 in which the carbon addition is from about 0.07 to about 0.12%.

4. A method as in claim 2 in which the extra tantalum addition comprises from about 12 to about 16 times the carbon addition.

* * * * *